(12) United States Patent
Lee

(10) Patent No.: US 8,053,792 B2
(45) Date of Patent: Nov. 8, 2011

(54) SEMICONDUCTOR LIGHT EMITTING DEVICE AND METHOD FOR MANUFACTURING THE SAME

(75) Inventor: Jo Young Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 156 days.

(21) Appl. No.: 12/201,987

(22) Filed: Aug. 29, 2008

(65) Prior Publication Data

US 2009/0057692 A1   Mar. 5, 2009

(30) Foreign Application Priority Data

Aug. 31, 2007  (KR) .................. 10-2007-0088286

(51) Int. Cl.
*H01L 29/20* (2006.01)
(52) U.S. Cl. ............ 257/89; 257/E21.001; 257/E33.001
(58) Field of Classification Search .................... 257/89, 257/E21.001, E33.001
See application file for complete search history.

(56) References Cited

U.S. PATENT DOCUMENTS

2005/0167680 A1* 8/2005 Shei et al. ................... 257/79
* cited by examiner

*Primary Examiner* — Kimberly D. Nguyen
*Assistant Examiner* — Marvin Payen
(74) *Attorney, Agent, or Firm* — Birch, Stewart, Kolasch & Birch, LLP

(57) ABSTRACT

Provided is a semiconductor light emitting device and a method for manufacturing the same. The semiconductor light emitting device comprises: a first semiconductor layer; a light emitting structure on one sided portion of the first semiconductor layer; a protection device structure on the other sided portion of the first semiconductor layer; and a first electrode layer on the protection device structure.

16 Claims, 3 Drawing Sheets

SEMICONDUCTOR LIGHT EMITTING DEVICE AND METHOD FOR MANUFACTURING THE SAME

CROSS-REFERENCE TO RELATED APPLICATIONS

The present application claims priority under 35 U.S.C. §119 of Korean Patent Application No. 10-2007-0088286 (filed on Aug. 31, 2007), which is hereby incorporated by reference in its entirety.

BACKGROUND

The present disclosure relates to a semiconductor light emitting device and a method of manufacturing the same.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device comprising a protection device structure, and a method for manufacturing the same.

Embodiments provide a semiconductor light emitting device and a method for manufacturing the same that can improve the reverse ESD by forming a protection device structure comprising a P-N junction at a first electrode region.

An embodiment provides a semiconductor light emitting device comprising: a first semiconductor layer; a light emitting structure on one sided portion of the first semiconductor layer; a protection device structure on the other sided portion of the first semiconductor layer; and a first electrode layer on the protection device structure.

An embodiment provides a semiconductor light emitting device comprising: an N-type first semiconductor layer on a substrate; a light emitting structure on one-sided portion of the N-type first semiconductor layer; a P-N junction protection device structure on the other sided portion of the N-type first semiconductor layer; a first electrode layer on the P-N junction protection device structure; and a second electrode layer on the light emitting structure.

An embodiment provides a method for manufacturing a semiconductor light emitting device comprising: forming a first semiconductor layer; forming a protection device structure on one-sided portion of the first semiconductor layer; forming a light emitting structure on the other-sided portion of the first semiconductor layer; and forming an electrode layers on the protection device structure and the light emitting structure.

The details of one or more embodiments are set forth in the accompanying drawings and the description below. Other features will be apparent from the description and drawings, and from the claims.

DETAILED DESCRIPTION OF THE EMBODIMENTS

Figure 1:
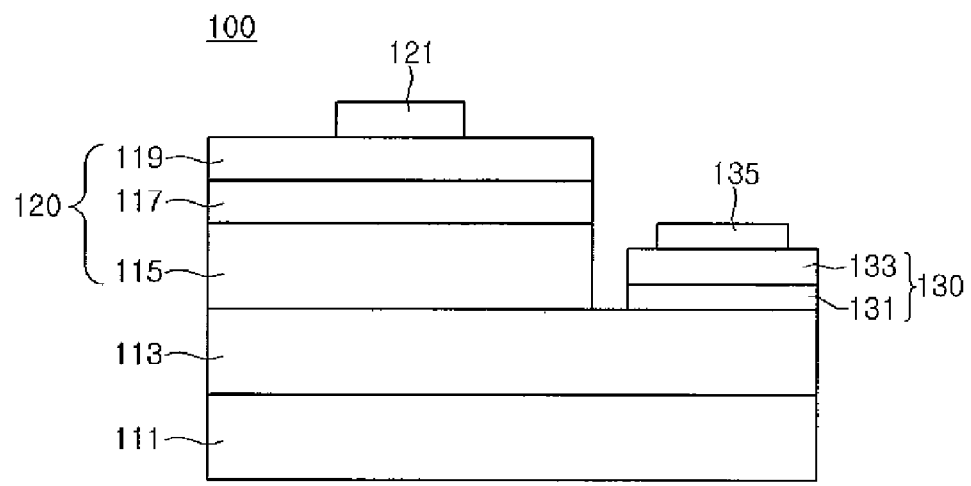
FIG. 1 is a side sectional view of a semiconductor light emitting device according to an embodiment.

A semiconductor light emitting device and a method for manufacturing the same according to an embodiment will be described in detail with reference to the accompanying drawings. In the description of embodiments, it will be understood that when a layer is referred to as being 'on' or 'under' another layer, the reference about 'on' and 'under' each layer will be made on the basis of drawings. Also, the thickness of each layer in the drawings is an example, and is not limited thereto.

FIG. 1 is a side sectional view of a semiconductor light emitting device according to an embodiment.

Referring to FIG. 1, the semiconductor light emitting device 100 comprises a substrate 111, an N-type first semiconductor layer 113, a light emitting structure 120, a protection device structure 130, a first electrode layer 135 and a second electrode layer 121.

The substrate 111 may be made of one selected from the group consisting of sapphire ($Al_2O_3$), GaN, SiC, ZnO, Si, GaP, GaAs and InP, or may comprise a conductive substrate. However, the material of the substrate 111 is not limited to the aforementioned examples. The substrate 111 may have an irregular surface pattern.

A nitride semiconductor may be grown on the substrate 111. The growth of the nitride semiconductor may be performed by an e-beam evaporator, a PVD (Physical vapor deposition) equipment, a CVD (Chemical vapor deposition) equipment, a PLD (Plasma laser deposition) equipment, a dual-type thermal evaporator, a sputter, an MOCVD (Metal organic chemical vapor deposition) equipment or the like, but the present invention is not limited thereto.

A buffer layer (not shown) or/and an undoped semiconductor layer (not shown) may be formed on the substrate 111. The buffer layer (not shown) is a layer to decrease a difference in lattice constant from the substrate 111, and may be selectively formed of GaN, AlN, AlGaN, InGaN or the like. The undoped semiconductor layer may be an undoped GaN layer, and functions as a substrate on which the nitride semiconductor is grown. The buffer layer or/and the undoped semiconductor layer may not be formed on the substrate 111.

The N-type semiconductor layer 113 is formed on the substrate 111. The N-type semiconductor layer 113 may be an electrode contact layer doped with an N-type dopant. The N-type semiconductor layer 113 may be a III-V compound and may be formed of a semiconductor material having a composition formula of $In_xAl_yGa_{1-x-y}N$ ($0 \leq x \leq 1$, $0 \leq y \leq 1$, $0 \leq x+y \leq 1$). The N-type semiconductor layer may be formed of at least one selected from the group consisting of GaN, InN, AlN, InGaN, AlGaN, InAlGaN, and AlInN. The N-type dopant comprises Si, Ge, Sn and the like.

The N-P junction or N-P-N junction light emitting structure 120 is disposed on one-sided portion of the N-type first semiconductor layer 113, and the P-N junction protection device structure 130 is disposed on the other sided portion of the N-type first semiconductor layer 113.

The N-P junction or N-P-N junction light emitting structure 120 comprises an N-type second semiconductor layer 115, an active layer 117 and a P-type first semiconductor layer 119. The P-N junction protection device structure 130 comprises a P-type second semiconductor layer 131 and an N-type third semiconductor layer 133. Each of the N-P junction or N-P-N junction light emitting structure 120 and the P-N junction protection device structure 130 may be defined as a structure comprising the N-type first semiconductor layer 113.

The N-type second semiconductor layer 115 is formed on one-sided portion of the N-type first semiconductor layer 113, the active layer 117 is formed on the N-type second semiconductor layer 115, and the P-type first semiconductor layer 119 is formed on the active layer 117.

The N-type second semiconductor layer 115 is doped with an N-type dopant, and may be formed of a III-V compound semiconductor, for example, a semiconductor material having a composition formula of $In_xAl_yGa_{1-x-y}N$ ($0 \leq x \leq 1$, $0 \leq y \leq 1$, $0 \leq x+y \leq 1$). The N-type second semiconductor layer 115 may be formed of at least one selected from the group consisting of GaN, InN, AlN, InGaN, AlGaN, InAlGaN, and AlInN. The N-type dopant comprises Si, Ge, Sn and the like. The N-type second semiconductor layer 115 may be formed of the same material as or a different material from the N-type first semiconductor layer 113. However, the present invention is not limited thereto.

The active layer 117 is formed in a single quantum well structure or a multiple quantum well structure. The active layer 117 may be a structure in which a well layer and a barrier layer are formed alternatingly in at least one period. The well layer may be formed of InGaN, GaN or InAlGaN, and the barrier layer may be formed of AlGaN, GaN or InAlGaN. The light emitting material of the active layer 117 may be changed according to light emitting wavelengths, such as blue wavelength, red wavelength, green wavelength, etc, but the present invention is not limited thereto.

A conductive clad layer (not shown) may be formed on or/and under the active layer 117, and may be an AlGaN layer.

The P-type first semiconductor layer 119 is doped with a P-type dopant, and may function as a second electrode contact layer. The P-type first semiconductor layer 119 may be formed of a III-V compound semiconductor, for example, a semiconductor material having a composition formula of $In_xAl_yGa_{1-x-y}N$ ($0 \leq x \leq 1$, $0 \leq y \leq 1$, $0 \leq x+y \leq 1$). For example, the P-type semiconductor layer may be formed of at least one selected from the group consisting of GaN, InN, AlN, InGaN, AlGaN, InAlGaN, and AlInN. The P-type dopant comprises Mg, Zn, Ca, Sr, and Ba. A transparent electrode layer (not shown) and an N-type semiconductor layer (not shown) may be formed on the P-type first semiconductor layer 119. The transparent electrode layer may be formed of at least one selected from the group consisting of ITO, ZnO, $IrO_x$, $RuO_x$ and NiO. However, the present invention is not limited thereto.

The second electrode layer 121 is formed on the P-type first semiconductor layer 119 of the light emitting structure 120.

The P-type second semiconductor layer 131 of the protection device structure 130 is formed in a first electrode region on the N-type first semiconductor layer 113. The P-type second semiconductor layer 131 is doped with a P-type dopant, and may be selected from the group consisting of GaN, InN, AlN, InGaN, AlGaN, InAlGaN, and AlInP. The P-type dopant comprises Mg, Zn, Ca, Sr, Ba, etc. The P-type second semiconductor layer 131 may be formed in a single layer or a superlattice structure, and forms a tunnel-junction with the N-type first semiconductor layer 113. The superlattice structure of the P-type second semiconductor layer 131 is selected from the group consisting of AlGaN/GaN, InGaN/GaN, GaN/GaN, and AlGaN/InGaN, and may be formed in 1~50 periods.

An N-type third semiconductor layer 133 is formed on the P-type second semiconductor layer 131. The N-type third semiconductor layer 133 is doped with an N-type dopant, and may be selected from the group consisting of GaN, InN, AlN, InGaN, AlGaN, InAlGaN and AlInN. The N-type dopant comprises Si, Ge, Sn, etc. The N-type third semiconductor layer 133 may be formed in a single layer or a superlattice structure. The superlattice structure of the N-type third semiconductor layer 133 is selected from the group consisting of AlGaN/GaN, InGaN/GaN, GaN/GaN, and AlGaN/InGaN and may be formed in 1~50 periods.

The P-type second semiconductor layer 131 may be formed in a thickness range of 5~500 Å for tunnel junction effect, and the N-type third semiconductor layer 133 may be formed in a thickness range of 10 Å to 3 μm.

The first electrode layer 135 is formed on the protection device structure 130. The first electrode layer 135 is formed on the N-type third semiconductor layer 133 of the protection device structure 130, and may be formed in a single or multilayer structure selected from the group consisting of Ti, Al, In, Ta, Pd, Co, Ni, Si, Ge, Ag and Au. However, the present invention is not limited thereto.

The size of the first electrode layer 135 may be equal to or smaller than the size of an upper surface of the protection device structure 130. However, the present invention is not limited thereto.

The P-type second semiconductor layer 131 and the N-type third semiconductor layer 133 of the protection device structure 130 are formed on the N-type first semiconductor layer 113 in a P-N junction structure. That is, the protection device structure 130 operates as a P-N junction diode connected in inverse-parallel with the light emitting structure 120.

In the above semiconductor light emitting device 100, when a forward current is applied to the first electrode layer 135 and the second electrode layer 121, the current applied to the first electrode 135 flows through the N-type third semiconductor layer 133, the P-type second semiconductor layer 131 and the N-type first semiconductor layer 113 by a tunneling. The active layer 117 normally emits light by electrons applied to the N-type second semiconductor layer 115 via the N-type first semiconductor layer 113 and holes applied to the P-type first semiconductor layer 119.

If a reverse ESD is applied to the first electrode layer 135, it flows through the N-type third semiconductor layer 133, the P-type second semiconductor layer 131 and the N-type first semiconductor layer 113. At this time, a micro-current flowing by the reverse ESD is dissipated by the P-N junction of the P-type second semiconductor layer 131 and the N-type first semiconductor layer 113. In other words, the P-N junction of the P-type second semiconductor layer 131 and the N-type first semiconductor layer 113 dissipates the reverse ESD by emitting light or heat using the combination of electrons and holes.

Accordingly, the micro-current due to the reverse ESD does not influence the active layer, so that the light emitting device 100 can improve the endurance against the reverse ESD.

FIGS. 2 to 7 are side sectional views illustrating a method for manufacturing a light emitting device according to an embodiment.

Figure 2:
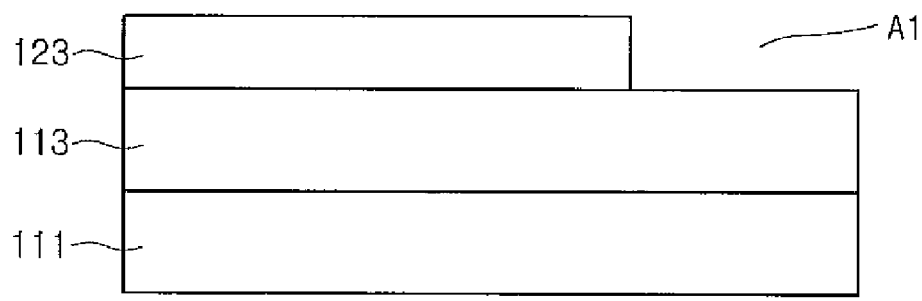
FIGS. 2 to 7 are side sectional views illustrating a method for manufacturing a light emitting device according to an embodiment.
Figure 3:
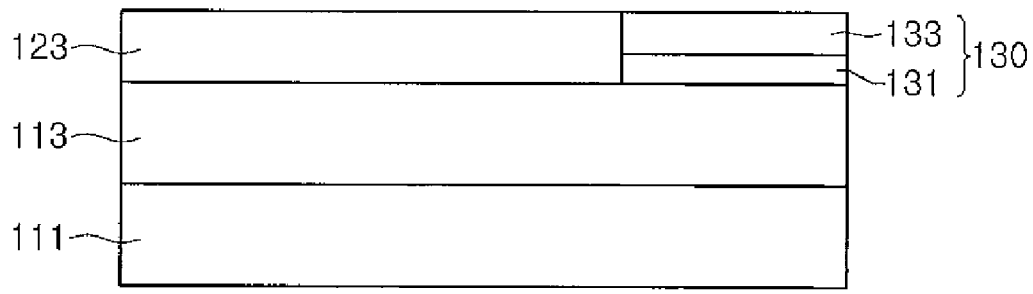

Referring to FIGS. 2 and 3, an N-type first semiconductor layer 113 is formed on a substrate 111.

The substrate 111 may be made of one selected from the group consisting of sapphire ($Al_2O_3$), GaN, SiC, ZnO, Si, GaP, GaAs and InP. A nitride semiconductor may be grown on the substrate 111. The growth of the nitride semiconductor may be performed by an e-beam evaporator, a PVD (Physical vapor deposition) equipment, a CVD (Chemical vapor deposition) equipment, a PLD (Plasma laser deposition) equipment, a dual-type thermal evaporator, a sputter, an MOCVD (Metal organic chemical vapor deposition) equipment or the like, but the present invention is not limited thereto.

A buffer layer (not shown) or/and an undoped semiconductor layer (not shown) may be formed on the substrate 111.

A first mask layer 123 is formed on one-sided portion of the N-type first semiconductor layer 113. The first mask layer 123 is formed on a region other than a first electrode region A1. The first mask layer 123 may be formed of at least one selected from the group consisting of $SiO_2$, $SiO_x$, $SiN_2$, $SiN_x$, $Si_xN_{1-x}$, and $SiO_xN_y$. However, the present invention is not limited thereto.

A protection device structure 130 is formed on the other sided portion of the N-type first semiconductor layer 113. The protection device structure 130 comprises a P-type second semiconductor layer 131 on the N-type first semiconductor layer 113, and an N-type third semiconductor layer 133 on the P-type second semiconductor layer 131. That is, the protection device structure 130 is formed in a P-N junction structure of the P-type second semiconductor layer 131 on the N-type first semiconductor layer 113, and the N-type third semiconductor layer 133.

The P-type second semiconductor layer 131 may be formed of at least one selected from the group consisting of GaN, InN, AlN, InGaN, AlGaN, InAlGaN and AlInN in a single layer or superlattice structure. Herein, the superlattice structure of the N-type second semiconductor layer 131 is selected from the group consisting of AlGaN/GaN, InGaN/GaN, GaN/GaN, and AlGaN/InGaN and may be formed in 1~50 periods.

The N-type third semiconductor layer 133 may be formed of at least one selected from the group consisting of GaN, InN, AlN, InGaN, AlGaN, InAlGaN and AlInN in a single layer or a superlattice structure. The superlattice structure of the N-type third semiconductor layer 133 is selected from the group consisting of AlGaN/GaN, InGaN/GaN, GaN/GaN, and AlGaN/InGaN and may be formed in 1~50 periods.

The P-type second semiconductor layer 131 may be formed thinly in a thickness range of 5~500 Å for tunnel junction effect, and the N-type third semiconductor layer 133 may be formed in a thickness range of 10 Å to 3 μm.

After the P-type second semiconductor layer 131 and the N-type third semiconductor layer 133 constituting the protection device structure 130 are formed, the first mask layer 123 is removed. The first mask layer 123 may be removed by a wet etching or/and a dry etching.

Figure 4:
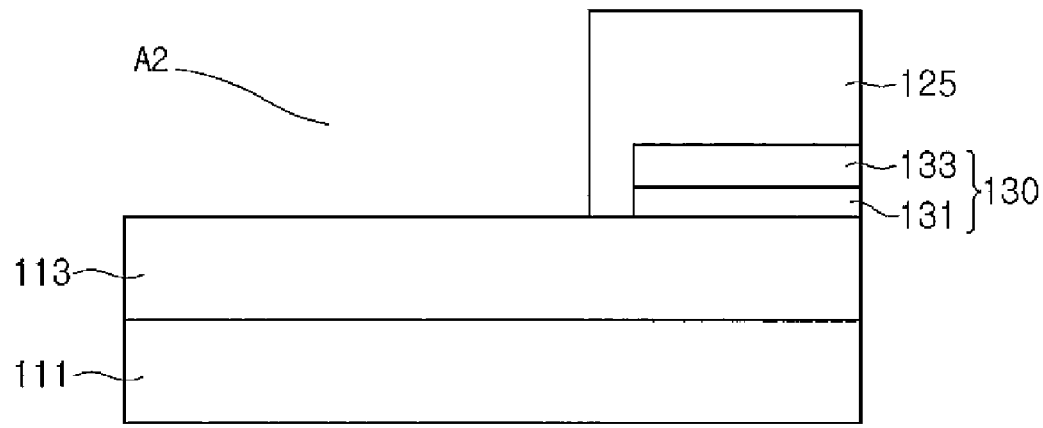
Figure 5:
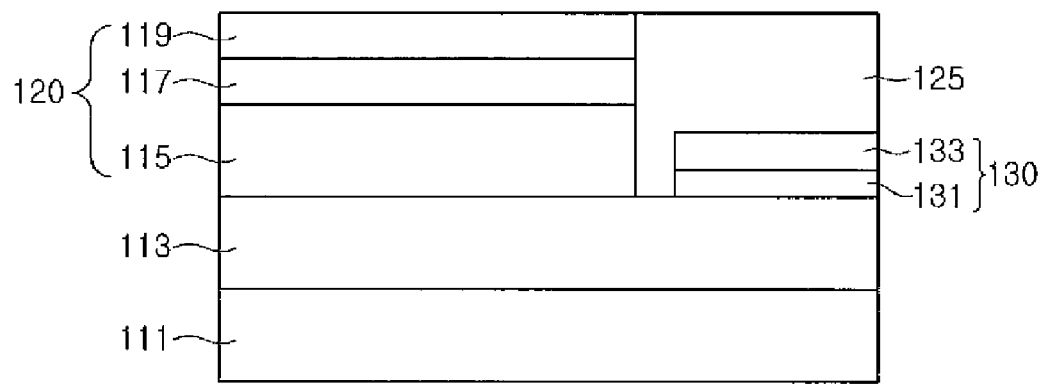

Referring to FIGS. 4 and 5, a second mask layer 125 is formed on the other sided portion of the N-type first semiconductor layer 113.

The second mask layer 125 is formed such that surfaces of the P-type second semiconductor layer 131 and the N-type third semiconductor layer 133 are not exposed. The second mask layer 125 may be formed at a height corresponding to that of a light emitting structure. The second mask layer 125 may be formed of at least one selected from the group consisting of $SiO_2$, $SiO_x$, $SiN_2$, $SiN_x$, $Si_xN_{1-x}$, and $SiO_xN_y$. However, the present invention is not limited thereto. Herein, the first mask layer 123 and the second mask layer 125 may be formed of the same material or different materials, but the present invention is not limited thereto.

A light emitting structure 120 is formed on a region A2 where the second mask layer 125 is not formed. The light emitting structures 120 comprises an N-type second semiconductor layer 115, an active layer 117 and a P-type first semiconductor layer 119. The N-type second semiconductor layer 115 is formed on one-sided portion of the N-type first semiconductor layer 113, the active layer 117 is formed on the N-type second semiconductor layer 115, and the P-type first semiconductor layer 119 is formed on the active layer 117.

The N-type second semiconductor layer 115 is doped with an N-type dopant, and may be formed of a III-V compound semiconductor, for example, a semiconductor material having a composition formula of $In_xAl_yGa_{1-x-y}N$ ($0 \leq x \leq 1$, $0 \leq y \leq 1$, $0 \leq x+y \leq 1$). The N-type second semiconductor layer 115 may be formed of the same material as or a different material from that of the N-type first semiconductor layer 113, but the present invention is not limited thereto.

The active layer 117 is formed in a single quantum well structure or a multiple quantum well structure. The active layer 117 may be a structure in which a well layer and a barrier layer are formed alternatingly in at least one period. The well layer may be formed of InGaN, GaN or InAlGaN, and the barrier layer may be formed of AlGaN, GaN or InAlGaN. The light emitting material of the active layer 117 may be changed according to light emitting wavelengths, such as blue wavelength, red wavelength, green wavelength, etc, but the present invention is not limited thereto.

A conductive clad layer (not shown) may be formed on or/and under the active layer 117, and may be an AlGaN layer.

The P-type first semiconductor layer 119 is doped with a P-type dopant, and may function as a second electrode contact layer. The P-type first semiconductor layer 119 may be formed of at least one selected from the group consisting of GaN, InN, AlN, InGaN, AlGaN, InAlGaN, and AlInN.

A transparent electrode layer (not shown) and an N-type semiconductor layer (not shown) may be formed on the P-type first semiconductor layer 119. The transparent electrode layer may be formed of at least one selected from the group consisting of ITO, ZnO, IrOx, RuOx and NiO. However, the present invention is not limited thereto.

Figure 6:
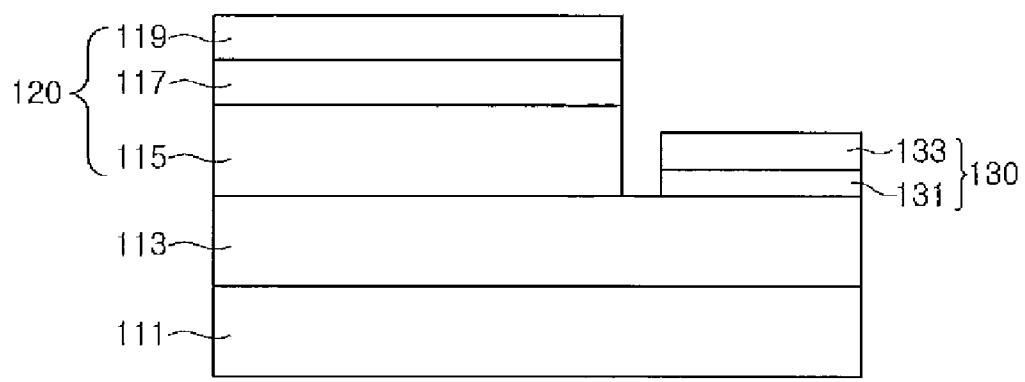

Referring to FIGS. 5 and 6, the second mask layer 125 formed around the P-type second semiconductor layer 131 and the N-type third semiconductor layer 133 is removed. Herein, since the second mask layer 125 is a transparent material, the second mask layer 125 may be partially removed to such a degree that the upper surface of the N-type third semiconductor layer 133 is exposed, or be completely removed. If some of the second mask layer 125 is left, the light extraction efficiency can be improved due to a difference in the refractive index between the N-type second semiconductor layer (ex: GaN) 115 and the second mask layer 125.

While the embodiment shows and describes that the protection device structure 130 is formed earlier than the light emitting structure 120 on the N-type first semiconductor layer 113, the light emitting structure 120 may be formed earlier than the protection device structure 130 and the protection device structure 130 may be formed later. However, the present invention is not limited thereto.

In the above semiconductor light emitting device 100, the light emitting structure 120 having an n-p junction or an n-p-n junction structure is formed on one sided portion of the N-type first semiconductor layer 113, and the protection device structure having a p-n junction structure is formed on the other sided portion of the N-type first semiconductor layer 113.

Figure 7:
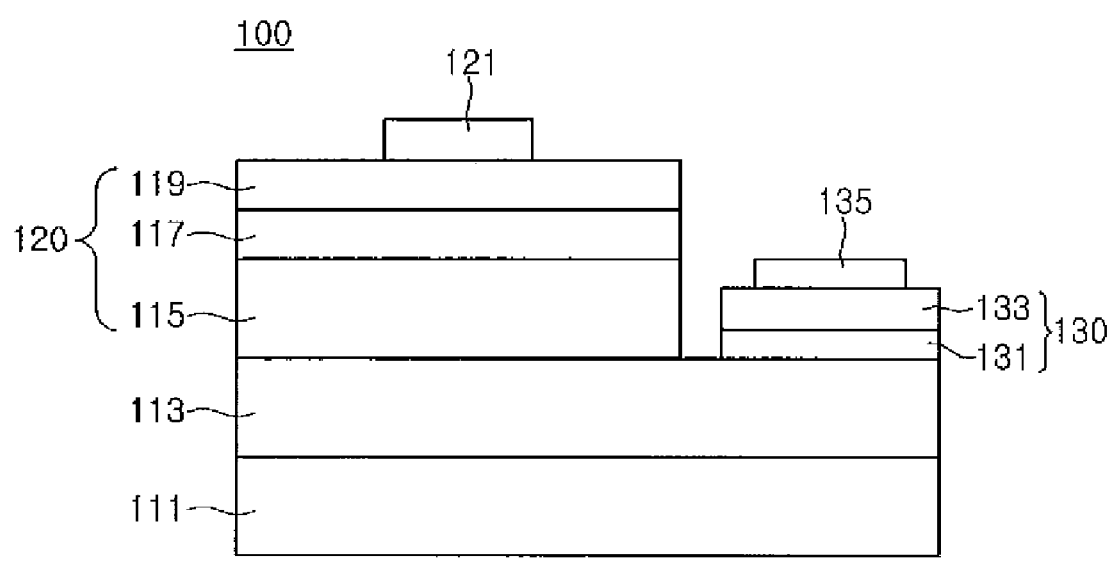

Referring to FIG. 7, a first electrode layer 135 may be formed on the N-type third semiconductor layer 133 of the protection device structure 130, and a second electrode layer 121 may be formed on the P-type first semiconductor layer 119 of the light emitting structure 120. In the present method, since a separate mesa etching process for the first electrode layer 135 is not performed, the manufacturing process can be simplified.

In the above semiconductor light emitting device 100, when a forward current is applied to the first electrode layer 135 and the second electrode layer 121, the current applied to the first electrode 135 flows through the N-type third semiconductor layer 133, the P-type second semiconductor layer 131 and the N-type first semiconductor layer 113 by a tunneling. The active layer 117 normally emits light by electrons applied to the N-type second semiconductor layer 115 via the N-type first semiconductor layer 113 and holes applied to the P type first semiconductor layer 119.

If a reverse ESD is applied to the first electrode layer 135, it flows through the N-type third semiconductor layer 133, the P-type second semiconductor layer 131 and the N-type first semiconductor layer 113. At this time, a micro-current flowing by the reverse ESD is dissipated by the P-N junction of the P-type second semiconductor layer 131 and the N-type first semiconductor layer 113. In other words, the P-N junction of the P-type second semiconductor layer 131 and the N-type first semiconductor layer 113 dissipates the reverse ESD by emitting light or heat using the combination of electrons and holes.

Accordingly, the micro-current due to the reverse ESD does not influence the active layer, so that the light emitting device 100 can improve the endurance against the reverse ESD.

Also, since the semiconductor light emitting device 100 can omit a mesa etching process using an ICP (Inductively coupled plasma) equipment, a damage of the semiconductor layer can be minimized to improve the device reliability.

In the description of embodiments, it will be understood that when a layer (or film), region, pattern or structure is referred to as being 'on' another layer (or film), region, pad or pattern, the terminology of 'on' and 'under' comprises both the meanings of 'directly' and 'indirectly'. Further, the reference about 'on' and 'under' each layer will be made on the basis of drawings. Also, the thickness of each layer in the drawings is an example, and is not limited thereto.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a substrate;
   an N-type first semiconductor layer on the substrate;
   a light emitting structure on a first area of the N-type first semiconductor layer;
   a protection device structure on a second area of the N-type first semiconductor layer; and
   a first electrode layer on the protection device structure,
   wherein the light emitting structure comprises: an N-type second semiconductor layer on the first area of the N-type first semiconductor layer; an active layer on the N-type second semiconductor layer; and a P-type first semiconductor layer on the active layer,
   wherein the protection device structure comprises: a P-type second semiconductor layer on the second area of the N-type first semiconductor layer; and an N-type third semiconductor layer on the P-type second semiconductor layer, and
   wherein the N-type first semiconductor layer, the P-type second semiconductor layer, and the N-type third semiconductor layer form an N-P-N junction, and when a reverse ESD is applied to the first electrode, the reverse ESD flows and dissipates through the N-P-N junction.

2. The semiconductor light emitting device of claim 1, wherein the N-type first semiconductor layer and the N-type second semiconductor layer satisfy a composition formula of $In_xAl_yGa_{1-x-y}N$ ($0 \leq x \leq 1$, $0 \leq y \leq 1$, $0 \leq x+y \leq 1$) as N-type semiconductor layers.

3. The semiconductor light emitting device of claim 1, wherein the P-type second semiconductor layer comprises a single layer or superlattice structure selected from the group consisting of GaN, InN, AlN, InGaN, AlGaN, InAlGaN and AlInN as a P-type semiconductor layer.

4. The semiconductor light emitting device of claim 1, wherein the N-type third semiconductor layer comprises a single layer or superlattice structure selected from the group consisting of GaN, InN, AlN, InGaN, AlGaN, InAlGaN and AlInN as an N-type semiconductor layer.

5. The semiconductor light emitting device of claim 1, wherein the P-type second semiconductor layer is formed in a thickness range of 5 Å to 500 Å to form a tunnel junction with the N-type first semiconductor layer, and the N-type third semiconductor layer is formed in a thickness range of 10 Å to 3 μm.

6. The semiconductor light emitting device of claim 1, comprising at least one of a second electrode layer, a transparent electrode layer and an N-type fourth semiconductor layer on the P-type first semiconductor layer.

7. The semiconductor light emitting device of claim 1, comprising at least one of an undoped semiconductor layer, and a buffer layer under the N-type first semiconductor layer.

8. A semiconductor light emitting device, comprising:
   a substrate;
   an N-type first semiconductor layer on the substrate;
   a light emitting structure on a first area of the N-type first semiconductor layer;
   a P-N junction protection device structure on a second area of the N-type first semiconductor layer;
   a first electrode layer on the P-N junction protection device structure; and
   a second electrode layer on the light emitting structure,
   wherein the light emitting structure comprises: an N-type second semiconductor layer on the first area of the N-type first semiconductor layer; an active layer on the N-type second semiconductor layer; and a P-type first semiconductor layer on the active layer,
   wherein the P-N junction protection device structure comprises: a P-type second semiconductor layer tunnel functioned on the second area of the N-type first semiconductor layer; and an N-type third semiconductor layer between the first electrode layer and the P-type second semiconductor layer, and wherein the N-type first semiconductor layer, the P-type second semiconductor layer, and the N-type third semiconductor layer form an N-P-N junction, and when a reverse ESD is applied to the first electrode, the reverse ESD flows and dissipates through the N-P-N junction.

9. The semiconductor light emitting device of claim 8, wherein the P-N junction protection device structure is connected in inverse-parallel with the light emitting structure.

10. The semiconductor light emitting device of claim 8, wherein the light emitting structure comprises an N-P-N junction structure.

11. The semiconductor light emitting device of claim 8, wherein the P-type second semiconductor layer and the N-type third semiconductor layer are formed of at least one selected from the group consisting of GaN, InN, AlN, InGaN, AlGaN, InAlGaN, and AlInN in a superlattice structure.

12. The semiconductor light emitting device of claim 8, comprising a transparent mask layer on the first area of the P-N junction protection device structure.

13. The semiconductor light emitting device of claim 8, wherein the P-type second semiconductor layer is formed in a thickness range of 5 Å to 500 Å to form a tunnel junction with the N-type first semiconductor layer.

14. The semiconductor light emitting device of claim 8, wherein the N-type third semiconductor layer is formed in a thickness range of 10 Å to 3 μm.

15. The semiconductor light emitting device of claim 8, wherein the light emitting structure connected on the N-type first semiconductor layer separates from the P-N junction protection device structure connected on the N-type first semiconductor layer.

16. The semiconductor light emitting device of claim 8, wherein the P-type second semiconductor layer and the N-type third semiconductor layer are formed in superlattice structure selected from the group consisting of GaN, InN, AlN, InGaN, AlGaN, InAlGaN and AlInN.

* * * * *